United States Patent
Kim et al.

(10) Patent No.: US 9,620,463 B2
(45) Date of Patent: Apr. 11, 2017

(54) RADIO-FREQUENCY (RF) SHIELDING IN FAN-OUT WAFER LEVEL PACKAGE (FOWLP)

(71) Applicant: QUALCOMM Incorporated, San Diego, CA (US)

(72) Inventors: Daeik Daniel Kim, Del Mar, CA (US); David Francis Berdy, San Diego, CA (US); Mario Francisco Velez, San Diego, CA (US); Changhan Hobie Yun, San Diego, CA (US); Chengjie Zuo, Santee, CA (US); Jonghae Kim, San Diego, CA (US); Matthew Michael Nowak, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 14/634,148

(22) Filed: Feb. 27, 2015

(65) Prior Publication Data

US 2016/0254237 A1 Sep. 1, 2016

(51) Int. Cl.
| | |
|---|---|
| *H01L 23/552* | (2006.01) |
| *H01L 23/60* | (2006.01) |
| *H01L 25/065* | (2006.01) |
| *H01L 21/56* | (2006.01) |
| *H01L 23/00* | (2006.01) |
| *H01L 23/538* | (2006.01) |

(52) U.S. Cl.
CPC ............ *H01L 23/60* (2013.01); *H01L 21/568* (2013.01); *H01L 23/538* (2013.01); *H01L 23/552* (2013.01); *H01L 24/00* (2013.01); *H01L 24/19* (2013.01); *H01L 24/96* (2013.01); *H01L 25/0655* (2013.01); *H01L 2224/04105* (2013.01)

(58) Field of Classification Search
None
See application file for complete search history.

(56) References Cited

U.S. PATENT DOCUMENTS

| 7,687,895 B2 * | 3/2010 | Brunnbauer .......... H01L 21/561 257/685 |
| 8,093,691 B1 * | 1/2012 | Fuentes ............... H01L 23/3128 257/659 |

(Continued)

OTHER PUBLICATIONS

Freescale's Redistributed Chip Packaging (RCP) Jane 2013, downloaded from URL <https://www.nxp.com/files/shared/doc/reports_presentations/RCPPRESENTATION.pdf> on Feb. 11, 2016.*
Keser, B., Introduction to Fan-Out Wafer Level Packaging, Beth Keser, Qualcomm Technologies, Inc, Mar. 6, 2015, downloaded from URL<http://www.iwlpc.com/papers/presentations/Keser_Beth_1.pdf> on Feb. 11, 2016.*

(Continued)

*Primary Examiner* — Joseph Schoenholtz
(74) *Attorney, Agent, or Firm* — Muncy, Geissler, Olds & Lowe, P.C.

(57) ABSTRACT

Ground shielding is achieved by a conductor shield having conductive surfaces that immediately surround individual chips within a fan-out wafer level package (FOWLP) module or device. Intra-module shielding between individual chips within the FOWLP module or device is achieved by electromagnetic or radio-signal (RF) isolation provided by the surfaces of the conductor shield immediately surrounding each of the chips. The conductor shield is directly connected to one or more grounded conductor portions of a FOWLP to ensure reliable grounding.

29 Claims, 4 Drawing Sheets

(56) References Cited

U.S. PATENT DOCUMENTS

| | | | |
|---|---|---|---|
| 8,276,268 B2 | 10/2012 | Kapusta et al. | |
| 8,378,466 B2* | 2/2013 | Chiu | H01L 21/568 |
| | | | 257/508 |
| 8,431,946 B2 | 4/2013 | Chiu et al. | |
| 8,587,096 B2 | 11/2013 | Kim et al. | |
| 9,257,393 B1* | 2/2016 | Gong | H01L 23/5389 |
| 2007/0138614 A1* | 6/2007 | Harrison | H01L 23/3677 |
| | | | 257/686 |
| 2009/0035895 A1* | 2/2009 | Lee | H01L 23/3121 |
| | | | 438/127 |
| 2009/0079041 A1 | 3/2009 | Huang et al. | |
| 2011/0198762 A1* | 8/2011 | Scanlan | H01L 23/528 |
| | | | 257/793 |
| 2012/0025356 A1* | 2/2012 | Liao | H01L 23/3121 |
| | | | 257/659 |
| 2012/0133032 A1* | 5/2012 | Tsai | H01L 23/552 |
| | | | 257/659 |
| 2012/0282767 A1 | 11/2012 | Jin et al. | |
| 2013/0045549 A1 | 2/2013 | Shiu et al. | |
| 2015/0024547 A1* | 1/2015 | Wang | H01L 23/3128 |
| | | | 438/107 |
| 2016/0218082 A1* | 7/2016 | Lee | H01L 25/0655 |

OTHER PUBLICATIONS

Chip Scale Review, vol. 19, No. 3, May-Jun. 2015.*
International Search Report and Written Opinion—PCT/US2016/016982—ISA/EPO—May 17, 2016.

* cited by examiner

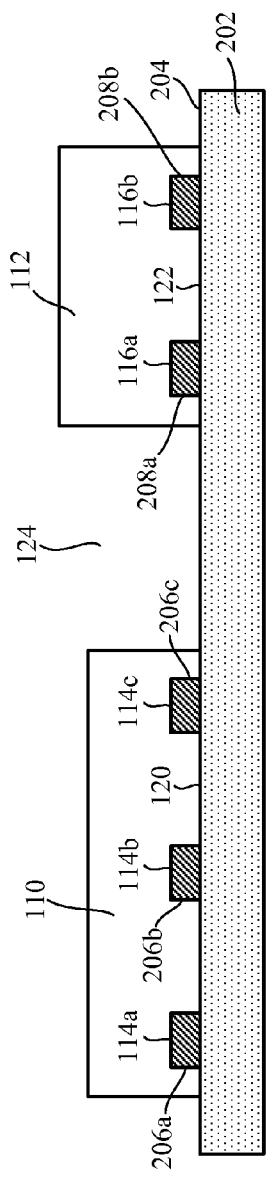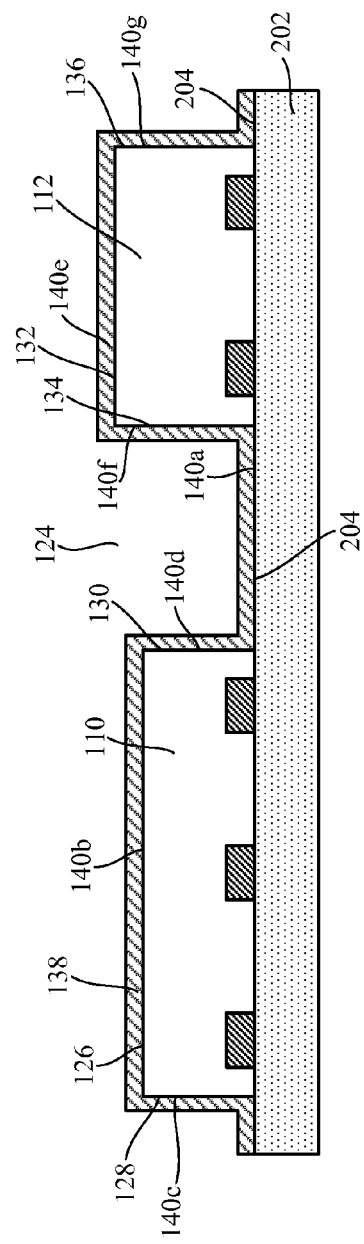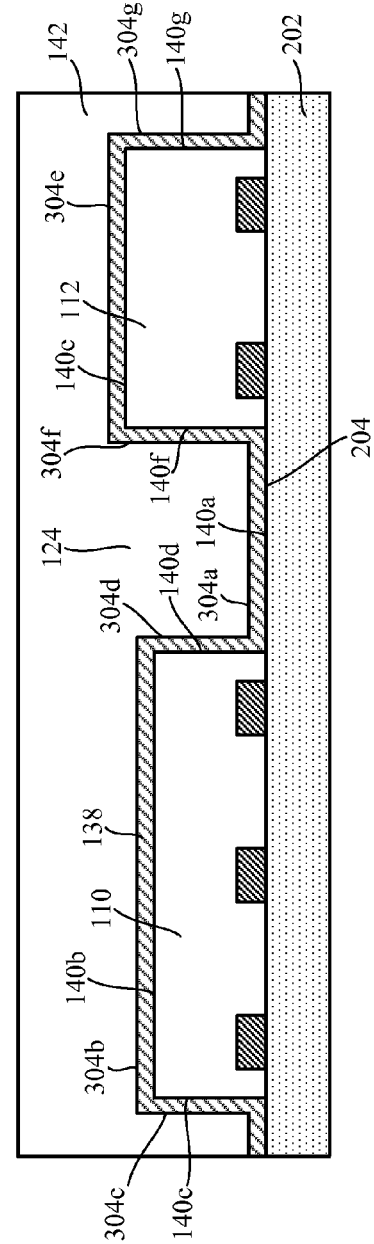

RADIO-FREQUENCY (RF) SHIELDING IN FAN-OUT WAFER LEVEL PACKAGE (FOWLP)

FIELD OF DISCLOSURE

Various embodiments described herein relate to integrated circuit packages, and more particularly, to fan-out wafer level packages (FOWLP).

BACKGROUND

In a conventional integrated circuit module with fan-out wafer level packaging, ground shielding of integrated circuit chips is typically provided by a metal shield surrounding a mold that covers all of the chips within the module. While such conventional ground shielding may be capable of providing inter-module shielding, that is, shielding between separate modules, it is not capable of providing intra-module shielding, that is, shielding between different chips within the same module. Moreover, the shielding planes of a conventional ground shield are positioned to surround the outer surfaces of the mold that covers all of the chips within the module, and are therefore separated by considerable distances from the circuits embedded within the chips. Therefore, the grounding effect of such conventional ground shields in conventional FOWLP modules may be limited.

SUMMARY

Exemplary embodiments of the disclosure are directed to integrated circuit devices and methods of making the same.

In an embodiment, a device is provided, the device comprising: a fan-out waver level package (FOWLP) comprising at least one conductor portion and at least one insulator portion; a first chip comprising a first plurality of contacts, the first chip positioned in direct contact with the FOWLP; a second chip comprising a second plurality of contacts, the second chip positioned in direct contact with the FOWLP, wherein the first chip and the second chip are spaced apart by a gap, and wherein said at least one conductor portion of the FOWLP is positioned directly opposite the gap between the first chip and the second chip; and a conductor shield comprising a plurality of conductor surfaces, wherein at least one of the conductor surfaces is directly connected to said at least one conductor portion of the FOWLP directly opposite the gap between the first chip and the second chip, wherein at least one of the conductor surfaces immediately surrounds the first chip, and wherein at least one of conductor surfaces immediately surrounds the second chip.

In another embodiment, a device is provided, the device comprising: a fan-out wafer level package (FOWLP) comprising a plurality of conductor portions and a plurality of dielectric portions, the FOWLP having a substantially flat first surface over the conductor portions and the dielectric portions; a first chip comprising a first plurality of contacts in direct contact with the FOWLP; a second chip comprising a second plurality of contacts in direct contact with the FOWLP, wherein the first chip and the second chip are spaced apart by a gap, and wherein at least one of the conductor portions of the FOWLP is positioned directly opposite the gap between the first chip and the second chip; and a conductor shield comprising a plurality of conductor surfaces, wherein at least one of the conductor surfaces is directly connected to said at least one of the conductor portions of the FOWLP directly opposite the gap between the first chip and the second chip, wherein at least one of the conductor surfaces immediately surrounds the first chip, and wherein at least one of the conductor surfaces immediately surrounds the second chip.

In another embodiment, a device is provided, the device comprising: a fan-out wafer level package (FOWLP) comprising a plurality of conductor portions and a plurality of insulator portions, the FOWLP having a substantially flat first surface over the conductor portions and the insulator portions; a first chip comprising a first plurality of contacts in direct contact with the FOWLP; a second chip comprising a second plurality of contacts in direct contact with the FOWLP, wherein the first chip and the second chip are spaced apart by a gap, and wherein at least one of the conductor portions of the FOWLP is positioned directly opposite the gap between the first chip and the second chip; and means for ground shielding the first chip and the second chip.

In yet another embodiment, a method of making a device is provided, the method comprising: providing a reconstitution tape having a first surface; providing a first plurality of contacts and a second plurality of contacts on the first surface of the reconstitution tape; providing a first chip having a first plurality of contact openings to receive the first plurality of contacts on the first surface of the reconstitution tape; providing a second chip having a second plurality of contact openings to receive the second plurality of contacts on the first surface of the reconstitution tape, wherein the first chip and the second chip are spaced apart by a gap exposing at least one portion of the first surface of the reconstitution tape; and providing a conductor shield comprising a plurality of conductor surfaces, wherein at least one of the conductor surfaces is in direct contact with said at least one portion of the reconstitution tape exposed by the gap between the first chip and the second chip, wherein at least one of the conductor surfaces immediately surrounds the first chip, and wherein at least one of conductor surfaces immediately surrounds the second chip.

BRIEF DESCRIPTION OF THE DRAWINGS

The accompanying drawings are presented to aid in the description of embodiments of the disclosure and are provided solely for illustration of the embodiments and not limitation thereof.

FIG. 2 is a cross-sectional view illustrating a first step in an embodiment of a method of making the FOWLP device of FIG. 1.

FIG. 3 is a cross-sectional view illustrating a second step in an embodiment of a method of making the FOWLP device of FIG. 1.

FIG. 4 is a cross-sectional view illustrating a third step in an embodiment of a method of making the FOWLP device of FIG. 1.

DETAILED DESCRIPTION

Aspects of the disclosure are described in the following description and related drawings directed to specific embodiments. Alternate embodiments may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

Figure 1:
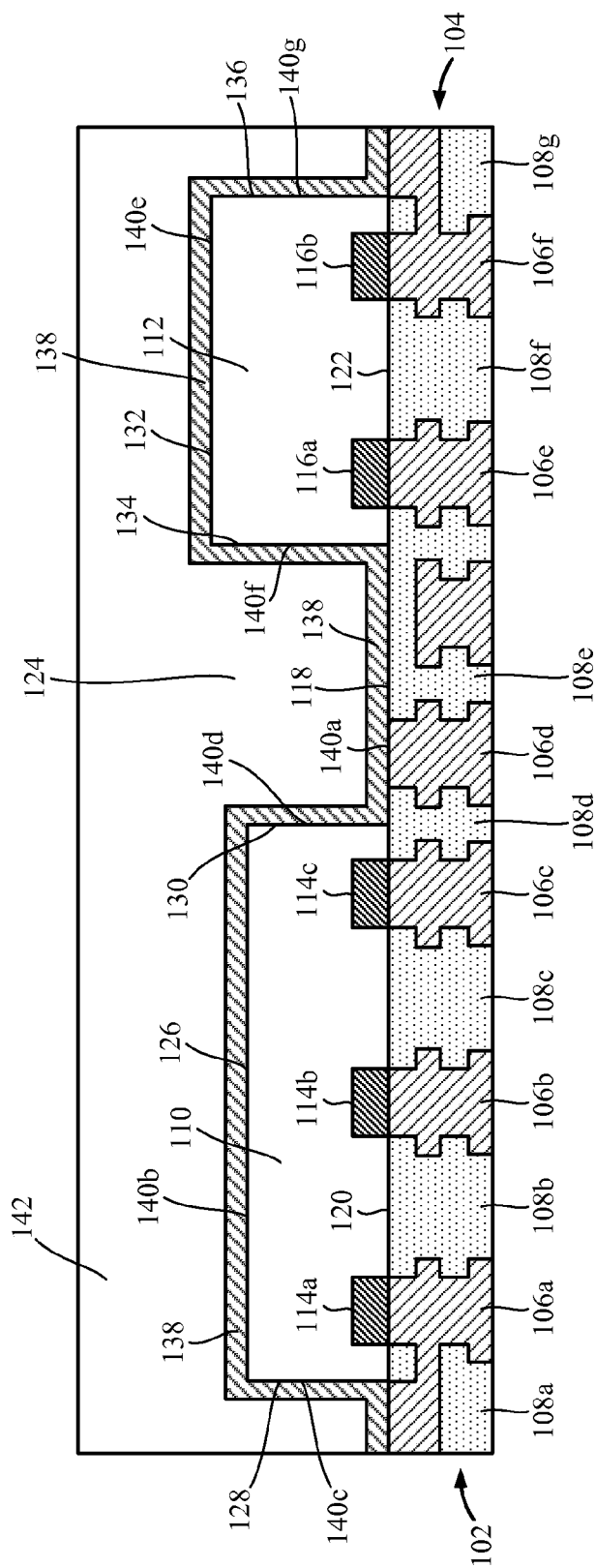
FIG. 1 is a cross-sectional view of an embodiment of a fan-out wafer level package (FOWLP) device with ground shielding immediately surrounding the chips within the device.

FIG. 1 is a cross-sectional view of an embodiment of a fan-out wafer level package (FOWLP) device with ground shielding immediately surrounding the chips within the device. In FIG. 1, a fan-out wafer level package (FOWLP) 102 is provided for a device with multiple chips. In an embodiment, the FOWLP 102 comprises one or more redistribution layers (RDLs) 104 which comprises one or more conductor portions 106a, 106b, 106c, . . . 106f and one or more insulator or dielectric portions 108a, 108b, 108c, . . . 108g. In an embodiment, the FOWLP 102 may include interposer-like wirings after assembly with a wafer level packaging (WLP) process to form a structure which may be regarded as an interposing FOWLP. A plurality of chips may be provided on the FOWLP 102, and one or more integrated circuits may be embedded in each of the chips in the FOWLP device. In the embodiment of FIG. 1, two chips 110 and 112 are shown for simplicity of illustration, although more than two chips may be provided in an FOWLP device within the scope of the disclosure. In the embodiment shown in FIG. 1, the first chip 110 includes a plurality of contacts 114a, 114b and 114c in direct contact with the FOWLP 102, and the second chip 112 also includes a plurality of contacts 116a and 116b in direct contact with the FOWLP 102. In an embodiment, the contacts 114a, 114b and 114c in the first chip 110 and the contacts 116a and 116b in the second chip 112 each comprise a conductive contact, for example, a metallic contact.

In an embodiment in which the FOWLP 102 comprises an FOWLP RDL 104, a plurality of conductor portions 106a, 106b, 106c, . . . 106f and a plurality of insulator or dielectric portions 108a, 108b, 108c, . . . 108g are provided in the FOWLP RDL 104. The conductor portions 106a, 106b, 106c, . . . 106f may be interspersed between the insulator or dielectric portions 108a, 108b, 108c, . . . 108g. In an embodiment, the conductor portions 106a, 106b, 106c, . . . 106f are patterned or positioned such that at least some of the conductor portions 106a, 106b, 106c, . . . 106f of the FOWLP RDL 104 are directly connected to respective conductive contacts in the chips supported by the interposing FOWLP. For example, in the embodiment illustrated in FIG. 1, the contacts 114a, 114b and 114c of the first chip 110 are directly connected to the conductor portions 106a, 106b and 106c of the FOWLP RDL 104, respectively, while the contacts 116a and 116b of the second chip 112 are directly connected to the conductor portions 106e and 106f of the FOWLP RDL 104, respectively.

In an embodiment, the FOWLP 102 or the FOWLP RDL 104 has a substantially flat top surface 118 over its conductor portions 106a, 106b, 106c, . . . 106f and its insulator or dielectric portions 108a, 108b, 108c, . . . 108g. In an embodiment, the first chip 110 has a substantially flat bottom surface 120 over its contacts 114a, 114b and 114c as well as over the rest of the bottom of the chip 110. In a similar manner, the second chip 112 also has a substantially flat bottom surface 122 over its contacts 116a and 116b as well as over the rest of the bottom of the chip 112. As such, the bottom surfaces 120 and 122 of both chips 110 and 112 are in direct contact with the top surface 118 of the FOWLP 102 or the FOWLP RDL 104. Furthermore, in the embodiment of the FOWLP device as illustrated in FIG. 1, the first chip 110 and the second chip 112 are spaced apart by a gap 124.

In the embodiment illustrated in FIG. 1, the first chip 110 has a substantially rectangular cross section with a top horizontal surface 126 and lateral surfaces 128 and 130, while the second chip 112 also has a substantially rectangular cross section with a top horizontal surface 132 and lateral surfaces 134 and 136. It will be appreciated, however, that the chips 110 and 112 need not have rectangular cross sections in alternate embodiments. In an embodiment, a conductor shield 138 for ground shielding both the first and second chips 110 and 112 is provided. In an embodiment, the conductor shield 138 has a plurality of conductor surfaces, including a first conductor surface 140a that is directly connected to the conductor portion 106d of the FOWLP 102 or the FOWLP RDL 104 beneath the gap 124 between the first chip 110 and the second chip 112.

In the embodiment shown in FIG. 1, the conductor shield 138 also has conductor surfaces 140b, 140c and 140d immediately surrounding the top horizontal surface 126 and the lateral surfaces 128 and 130 of the first chip 110, respectively. In a similar manner, the conductor shield 138 further includes conductor surfaces 140e, 140f and 140g immediately surrounding the top horizontal surface 132 and the lateral surfaces 134 and 136 of the second chip 112, respectively. In an embodiment, the conductor portion 106d of the FOWLP 102 or the FOWLP RDL 104 may be grounded, thereby grounding the entire conductor shield 138 during electrical operations. In a further embodiment, the conductor shield 138 may be grounded by electrical connections with more than one grounded conductor portion of the FOWLP 102 or the FOWLP RDL 104. For example, as illustrated in the embodiment shown in FIG. 1, the conductor shield 138 is also directly connected to the conductor portions 106a and 106f of the FOWLP 102 or the FOWLP RDL 104 to the left and right sides of the first and second chips 110 and 112, in addition to the conductor portion 106d of the FOWLP 102 or the FOWLP RDL 104 directly opposite the gap 124 between the first and second chips 110 and 112. In a further embodiment, a mold 142 is provided on outer surfaces opposite the surfaces 140a, 140b, 140c, . . . 140g of the conductor shield 138 and is separated from the first and second chips 110 and 112 by the conductor shield 138.

FIG. 2 is a cross-sectional view illustrating a first step in an embodiment of a method of making the FOWLP device of FIG. 1. In this embodiment, a reconstitution tape 202 is initially provided but will later be removed in the manufacturing of the FOWLP device. The FOWLP device according to embodiments of the disclosure may also be made in various alternative manners with or without using a reconstitution tape. Referring to FIG. 2, the reconstitution tape 202 has a substantially flat top surface 204 for supporting a plurality of chips which will later become parts of an FOWLP device. In the embodiment shown in FIG. 2, a first plurality of contacts 114a, 114b and 114c and a second plurality of contacts 116a and 116b are provided on the first surface 204 of the reconstitution tape 202. In a further embodiment, the first and second plurality of contacts 114a, 114b, 114c, 116a and 116b may comprise conductive or metallic contacts.

In an embodiment, two chips 110 and 112 are provided on the top surface 204 of the reconstitution tape 202. In a further embodiment, the first chip 110 has a first plurality of contact openings 206a, 206b and 206c recessed from its bottom surface 120, and the contact openings 206a, 206b and 206c are positioned to receive the contacts 114a, 114b and 114c, respectively, on the top surface 204 of the reconstitution tape 202. In a similar manner, the first chip 110 has a second plurality of contact openings 208a and 208b recessed from its bottom surface 122, and the contact openings 208a and 208b are positioned to receive the contacts 116a and 116b, respectively, on the top surface 204 of the reconstitution tape 202.

FIG. 3 is a cross-sectional view illustrating a second step in an embodiment of a method of making the FOWLP device of FIG. 1. In FIG. 3, a conductor shield 138 is provided on the first and second chips 110 and 112 and over portions of the top surface 204 of the reconstitution tape 202 not covered by the first and second chips 110 and 112, including the portion of the top surface 204 of the reconstitution tape 202 exposed or otherwise not covered by the gap 124 between the first chip 110 and the second chip 112. As illustrated in FIG. 3, the conductor surfaces of the conductor shield 138 include a conductor surface 140a that is in direct contact with the portion of the top surface 204 of the reconstitution tape 202 below the gap 124 between the first chip 110 and the second chip 112.

The conductor surfaces of the conductor shield 138 also include conductor surfaces 140b, 140c and 140d in direct contact with the top horizontal surface 126 and the lateral surfaces 128 and 130 of the first chip 110, as well as conductor surfaces 140e, 140f and 140g in direct contact with the top horizontal surface 132 and the lateral surfaces 134 and 136 of the second chip 112. In the embodiment illustrated in FIG. 3, the conductor shield 138 is also in direct contact with the top surface 204 of the reconstitution tape to the left and right sides of the first and second chips 110 and 112. In an embodiment, the conductor shield 138 may be provided as a conformal shield over the first and second chips 110 and 112 and exposed portions of the top surface 204 of the reconstitution tape 202 by using one or more types of metal processes such as plating, sputtering, deposition, or another conventional process known to persons skilled in the art.

FIG. 4 is a cross-sectional view illustrating a third step in an embodiment of a method of making the FOWLP device of FIG. 1. In an embodiment, a mold 142 may be disposed on the outer surfaces of the conductor shield 138 in a conventional molding process known to persons skilled in the art. As illustrated in FIG. 4, the conductor shield 138 has an outer surface 304a directly opposite the surface 140a that is in contact with the top surface 204 of the reconstitution tape 202 below the gap 124 between the first and second chips 110 and 112, outer surfaces 304b, 304c and 304d directly opposite the surfaces 140b, 140c and 140d that immediately surround the first chip 110, respectively, and outer surfaces 304e, 304f and 304g directly opposite the surfaces 140e, 140f and 140g that immediately surround the second chip 112, respectively. As illustrated in FIG. 4, the mold 142 is not in direct contact with the surfaces of the reconstitution tape 202 or any of the first and second chips 110 and 112.

Figure 5:
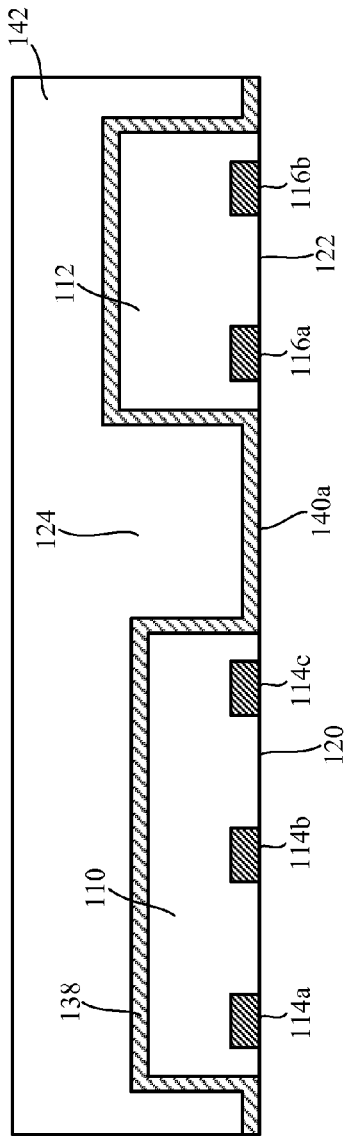
FIG. 5 is a cross-sectional view illustrating a fourth step in an embodiment of a method of making the FOWLP device of FIG. 1.

FIG. 5 is a cross-sectional view illustrating a fourth step in an embodiment of a method of making the FOWLP device of FIG. 1. In FIG. 5, the reconstitution tape 202 has been removed. As illustrated in FIG. 5, the bottom surface 120 as well as the contacts 114a, 114b and 114c of the first chip 110, the bottom surface 122 as well as the contacts 116a and 116b of the second chip 112, and the conductor surface 140a of the conductor shield 138 directly beneath the gap 124 between the first and second chips 110 and 112 are exposed after the removal of the reconstitution tape 202. In an embodiment, the bottom surfaces 120 and 122 of the first and second chips 110 and 112, including the exposed surfaces of the contacts 114a, 114b, 114c, 116a and 116b, and the conductor surface 140a of the conductor shield 138 are substantially flush with each other to form a substantially flat bottom.

Figure 6:
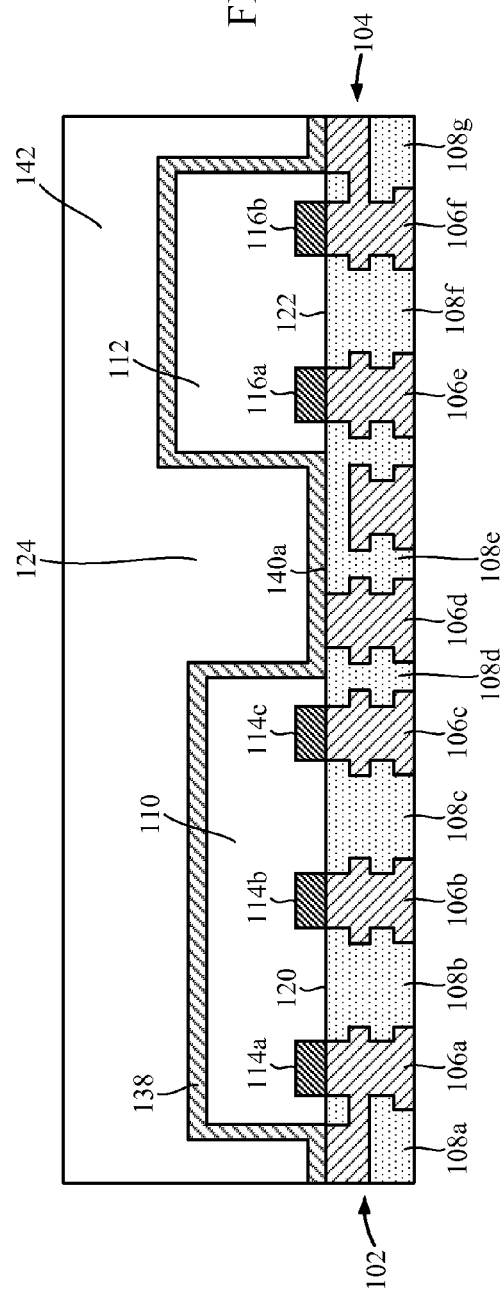
FIG. 6 is a cross-sectional view illustrating a fifth step in an embodiment of a method of making the FOWLP device of FIG. 1.

FIG. 6 is a cross-sectional view illustrating a fifth step in an embodiment of a method of making the FOWLP device of FIG. 1. In FIG. 6, a FOWLP 102 or an FOWLP RDL 104 is provided to the bottom surfaces 120 and 122 of the first and second chips 110 and 112 and the conductor surface 140a of the conductor shield 138. An FOWLP RDL 104 may be provided to these surfaces by using a redistribution layer (RDL) process, or another process known to persons skilled in the art. In the embodiment shown in FIG. 6, the FOWLP RDL 104 includes a plurality of conductor portions 106a, 106b, 106c, . . . 106f interspersed between a plurality of insulator or dielectric portions 108a, 108b, 108c, . . . 108g. As illustrated in FIG. 6, the contacts 114a, 114b and 114c of the first chip 110 are directly connected to the conductor portions 106a, 106b and 106c of the FOWLP RDL 104, respectively, while the contacts 116a and 116b of the second chip 112 are directly connected to the conductor portions 106e and 106f of the FOWLP RDL 104, respectively. The conductor surface 140a of the conductor shield 138 in the gap 124 between the first and second chips 110 and 112 is in direct contact with the conductor portion 106d of the FOWLP RDL 104, which may be grounded in electrical operations. Additional ground contacts may be provided for the conductor shield 138, for example, by grounding the conductor portions 106a and 106f of the FOWLP RDL 104, which are also directly connected to the conductor shield 138.

Figure 7:
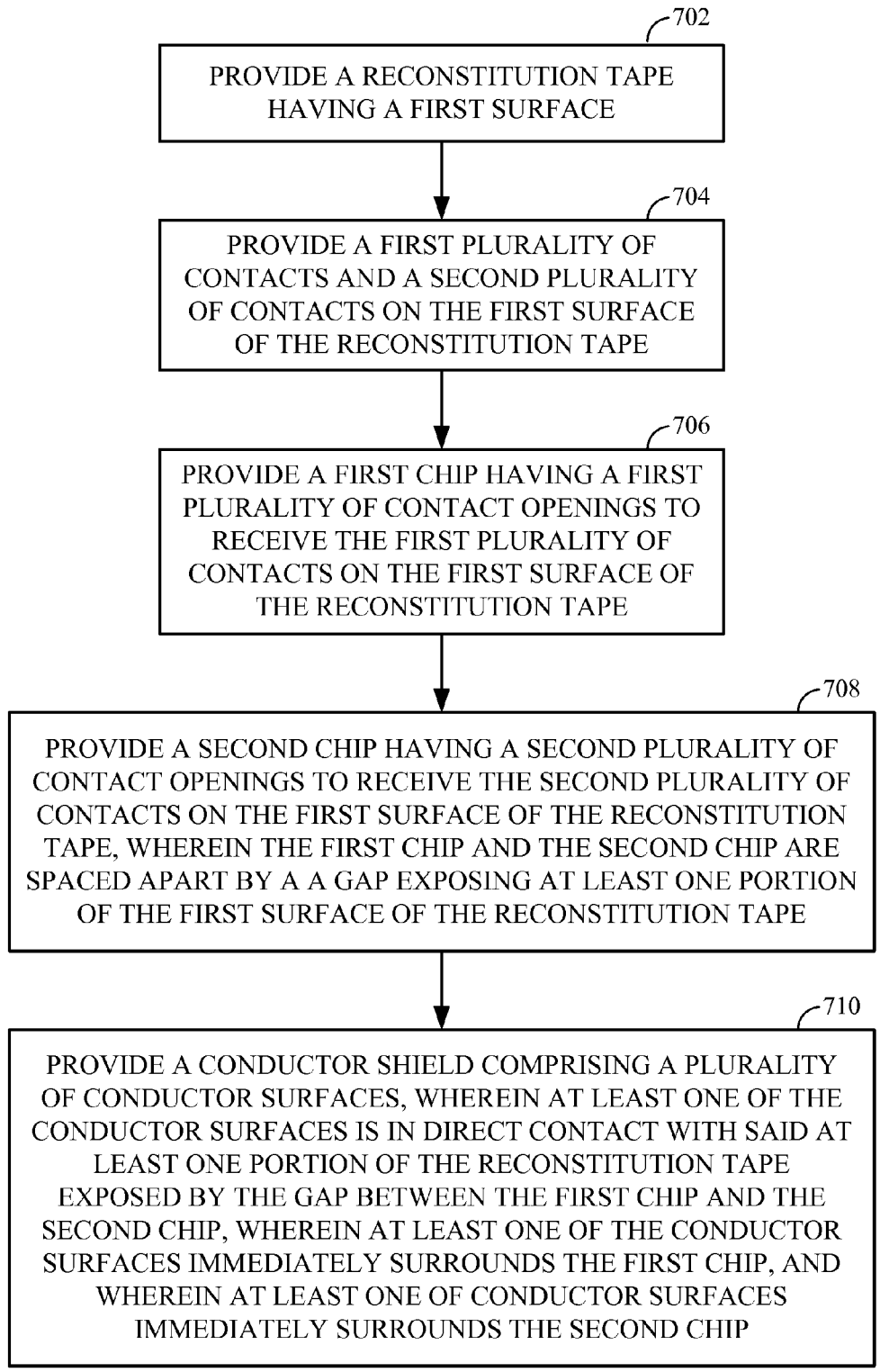
FIG. 7 is a flowchart illustrating process steps in an embodiment of a method of making an FOWLP device.

FIG. 7 is a flowchart illustrating process steps in an embodiment of a method of making an FOWLP device. In FIG. 7, a reconstitution tape having a first surface is provided in block 702. A first plurality of contacts and a second plurality of contacts are provided on the first surface of the reconstitution tape in block 704. A first chip having a first plurality of contact openings to receive the first plurality of contacts is provided on the first surface of the reconstitution tape in block 706. A second chip having a second plurality of contact openings to receive the second plurality of contacts is provided on the first surface of the reconstitution tape in block 708. In an embodiment, the first chip and the second chip are spaced apart by a gap exposing at least one portion of the first surface of the reconstitution tape.

A conductor shield comprising a plurality of conductor surfaces is provided in block 710. In an embodiment, at least one of the conductor surfaces is in direct contact with at least one portion of the reconstitution tape exposed by the gap between the first chip and the second chip. In an embodiment, at least one of the conductor surfaces immediately surrounds the first chip, and at least one of conductor surfaces immediately surrounds the second chip. In a further embodiment, a molding is provided outside the conductor shield. In an embodiment, the reconstitution tape is removed to expose the bottom surface of the first chip including the first plurality of contacts, the bottom surface of the second chip including the second plurality of contacts, and the bottom surface of the portion of the conductor shield between the first and second chips. In an embodiment, an FOWLP RDL is provided on the bottom surfaces of the first and second chips and the portion of the conductor shield between the first and second chips. In a further embodiment, the FOWLP RDL may be provided by using an RDL process.

With a conductor shield that immediately surrounds each of the chips in an FOWLP device or module, intra-module shielding between different chips within the same FOWLP device or module is attained. Furthermore, the conductor shield may be grounded by direct contacts with one or more grounded conductor portions of an FOWLP, thereby achieving reliable grounding of the conductor shield. With compact compartmentalized ground shielding, various digital, analog, mixed signal, or RF circuits on the same device or module may operate without undesirable electromagnetic or radio-signal (RF) interference between one another.

While the foregoing disclosure shows illustrative embodiments, it should be noted that various changes and modifications could be made herein without departing from the scope of the appended claims. The functions, steps or actions of the method claims in accordance with embodiments described herein need not be performed in any particular order unless expressly stated otherwise. Furthermore, although elements may be described or claimed in the singular, the plural is contemplated unless limitation to the singular is explicitly stated.

What is claimed is:

1. A device, comprising:
a fan-out wafer level package (FOWLP) comprising at least one conductor portion and at least one insulator portion;
a first chip comprising a first plurality of contacts, the first chip positioned in direct contact with the FOWLP;
a second chip comprising a second plurality of contacts, the second chip positioned in direct contact with the FOWLP, the first chip and the second chip spaced apart by a gap, and the at least one conductor portion of the FOWLP positioned directly opposite the gap between the first chip and the second chip; and
a conductor shield comprising a plurality of conductor surfaces, at least one of the conductor surfaces directly connected to the at least one conductor portion of the FOWLP directly opposite the gap between the first chip and the second chip, at least one of the conductor surfaces immediately surrounding the first chip, and at least one of conductor surfaces immediately surrounding the second chip,
wherein a bottom surface of the first chip including bottom surfaces of the first plurality of contacts, a bottom surface of the second chip including bottom surfaces of the second plurality of contacts, and the at least one of the conductor surfaces directly connected to the at least one conductor portion of the FOWLP directly opposite the gap between the first chip and the second chip are substantially flush with each other.

2. The device of claim 1, wherein the FOWLP comprises an interposing FOWLP.

3. The device of claim 2, wherein the interposing FOWLP comprises a plurality of dielectric portions and a plurality of conductor portions.

4. The device of claim 3,
wherein the dielectric portions of the interposing FOWLP include the at least one insulator portion of the FOWLP, and
wherein the conductor portions of the interposing FOWLP include the at least one conductor portion of the FOWLP.

5. The device of claim 1, wherein the first and second pluralities of contacts comprise conductive contacts.

6. The device of claim 1,
wherein the FOWLP comprises a plurality of conductor portions including the at least one conductor portion, and
wherein at least some of the first and second pluralities of contacts are directly connected to at least some of the conductor portions of the FOWLP.

7. The device of claim 1,
wherein the FOWLP comprises a plurality of insulator portions including the at least one insulator portion,
wherein the first chip is directly connected to at least one of the insulator portions of the FOWLP, and
wherein the second chip is directed connected to at least another one of the insulator portions of the FOWLP.

8. The device of claim 1, further comprising a mold disposed on the conductor shield.

9. The device of claim 8, wherein the mold is separated from the first and second chips by the conductor shield.

10. A device, comprising:
a fan-out wafer level package (FOWLP) comprising a plurality of conductor portions and a plurality of dielectric portions, the FOWLP having a substantially flat first surface over the conductor portions and the dielectric portions;
a first chip comprising a first plurality of contacts in direct contact with the FOWLP;
a second chip comprising a second plurality of contacts in direct contact with the FOWLP, the first chip and the second chip spaced apart by a gap, and at least one of the conductor portions of the FOWLP positioned directly opposite the gap between the first chip and the second chip; and
a conductor shield comprising a plurality of conductor surfaces, at least one of the conductor surfaces directly connected to the at least one of the conductor portions of the FOWLP directly opposite the gap between the first chip and the second chip, at least one of the conductor surfaces immediately surrounding the first chip, and at least one of the conductor surfaces immediately surrounding the second chip, wherein a bottom surface of the first chip including bottom surfaces of the first plurality of contacts, a bottom surface of the second chip including bottom surfaces of the second plurality of contacts, and the at least one of the conductor surfaces directly connected to the at least one of the conductor portions of the FOWLP directly opposite the gap between the first chip and the second chip are substantially flush with each other.

11. The device of claim 10, wherein the first and second pluralities of contacts comprise conductive contacts.

12. The device of claim 10, wherein at least some of the first and second pluralities of contacts are directly connected to at least some of the conductor portions of the FOWLP.

13. The device of claim 10,
wherein the first chip is directly connected to at least one of the dielectric portions of the FOWLP, and
wherein the second chip is directed connected to at least another one of the dielectric portions of the FOWLP.

14. The device of claim 10, further comprising a mold disposed on the conductor shield.

15. The device of claim 14, wherein the mold is separated from the first and second chips by the conductor shield.

16. A device, comprising:
a fan-out wafer level package (FOWLP) comprising a plurality of conductor portions and a plurality of insulator portions, the FOWLP having a substantially flat first surface over the plurality of conductor portions and the plurality of insulator portions;
a first chip comprising a first plurality of contacts in direct contact with the FOWLP;
a second chip comprising a second plurality of contacts in direct contact with the FOWLP, the first chip and the second chip spaced apart by a gap, and at least one of the plurality of conductor portions of the FOWLP positioned directly opposite the gap between the first chip and the second chip; and
means for ground shielding the first chip and the second chip,
wherein a bottom surface of the first chip including bottom surfaces of the first plurality of contacts and a bottom surface of the second chip including bottom surfaces of the second plurality of contacts are substantially flush with each other.

17. The device of claim 16,
wherein the means for ground shielding the first chip and the second chip comprises a conductor shield comprising a plurality of conductor surfaces,
wherein at least one of the conductor surfaces is directly connected to the at least one of the conductor portions of the FOWLP directly opposite the gap between the first chip and the second chip,
wherein at least one of the conductor surfaces immediately surrounds the first chip, and
wherein at least one of the conductor surfaces immediately surrounds the second chip.

18. The device of claim 16, wherein the first and second pluralities of contacts comprise conductive contacts.

19. The device of claim 16, wherein at least some of the first and second pluralities of contacts are directly connected to at least some of the conductor portions of the FOWLP.

20. The device of claim 16,
wherein the first chip is directly connected to at least one of the insulator portions of the FOWLP, and
wherein the second chip is directed connected to at least another one of the insulator portions of the FOWLP.

21. The device of claim 16, wherein the FOWLP comprises an interposing FOWLP.

22. The device of claim 16, further comprising a mold disposed on the means for ground shielding.

23. The device of claim 22, wherein the mold is separated from the first and second chips by the means for ground shielding.

24. A method of making a device, comprising:
providing a reconstitution tape having a first surface;
providing a first plurality of contacts and a second plurality of contacts on the first surface of the reconstitution tape;
providing a first chip having a first plurality of contact openings to receive the first plurality of contacts on the first surface of the reconstitution tape;
providing a second chip having a second plurality of contact openings to receive the second plurality of contacts on the first surface of the reconstitution tape, wherein the first chip and the second chip are spaced apart by a gap exposing at least one portion of the first surface of the reconstitution tape;
providing a conductor shield comprising a plurality of conductor surfaces, wherein at least one of the conductor surfaces is in direct contact with the at least one portion of the first surface of the reconstitution tape exposed by the gap between the first chip and the second chip, wherein at least one of the conductor surfaces immediately surrounds the first chip, and wherein at least one of the conductor surfaces immediately surrounds the second chip; and
removing the reconstitution tape to expose a first surface of the first chip including the first plurality of contacts, a first surface of the second chip including the second plurality of contacts, and the at least one of the conductor surfaces of the conductor shield between the first chip and the second chip.

25. The method of claim 24, wherein the providing the conductor shield comprises providing conformal shielding with a metal on the first chip, on the second chip, and on the at least one portion of the first surface of the reconstitution tape exposed by the gap between the first chip and the second chip.

26. The method of claim 24, further comprising providing a molding outside the conductor shield.

27. The method of claim 24, further comprising providing an interposing fan-out wafer level package (FOWLP) on the first surface of the first chip including the first plurality of contacts, on the first surface of the second chip including the second plurality of contacts, and on the at least one of the conductor surfaces of the conductor shield between the first chip and the second chip.

28. The method of claim 27,
wherein the interposing FOWLP comprises a plurality of conductor portions and a plurality of dielectric portions, and
wherein at least some of the conductor portions of the interposing FOWLP are directly connected to at least some of the first and second pluralities of contacts of the first and second chips.

29. The method of claim 27, wherein the providing an interposing FOWLP comprises providing the interposing FOWLP by a redistribution layer (RDL) process.

* * * * *